(12) United States Patent
Bartyzel

(10) Patent No.: US 6,331,937 B1
(45) Date of Patent: Dec. 18, 2001

(54) APPARATUS AND METHOD FOR SECURING A HEAT SINK TO AN ELECTRONIC COMPONENT IN A COMPUTER SYSTEM

(75) Inventor: Bernd Bartyzel, Austin, TX (US)

(73) Assignee: Dell USA, L.P., Round Rock, TX (US)

( * ) Notice: Subject to any disclaimer, the term of this patent is extended or adjusted under 35 U.S.C. 154(b) by 0 days.

(21) Appl. No.: 09/362,247

(22) Filed: Jul. 28, 1999

(51) Int. Cl.[7] ....................................... G06F 1/20
(52) U.S. Cl. .................... 361/687; 361/719; 361/720; 257/718
(58) Field of Search ................... 361/687, 719–720, 361/704, 700, 695, 697, 699; 257/719, 718; 165/185; 174/16.3; 411/508; 24/453

(56) References Cited

U.S. PATENT DOCUMENTS

| | | | |
|---|---|---|---|
| 5,852,739 | * | 12/1998 | Radloff et al. ................ 361/683 |
| 5,901,039 | * | 5/1999 | Dehaine et al. ............... 361/704 |
| 5,978,223 | * | 11/1999 | Hamilton et al. .............. 361/704 |
| 6,017,226 | * | 1/2000 | Jeffries et al. ................. 361/758 |
| 6,061,240 | * | 5/2000 | Butterbaugh et al. .......... 361/707 |

* cited by examiner

*Primary Examiner*—Leo P. Picard
*Assistant Examiner*—Hung Vam Duong
(74) *Attorney, Agent, or Firm*—Haynes and Boone, LLP

(57) ABSTRACT

A retaining clip including a hollow shaft having a first end and a second end. A flange is fixedly attached at the first end of the shaft. The shaft and the flange are integrally formed. A plurality of retention members are resiliently attached to the shaft adjacent to the second end of the shaft. A helically wound spring is carried by the shaft and extends from adjacent to the flange towards the retention member. The retention clip may be used to attach a heat sink assembly to a printed circuit module. Each spring is capable of providing a force to engage the heat sink against the heat generating component with a constant force.

11 Claims, 3 Drawing Sheets

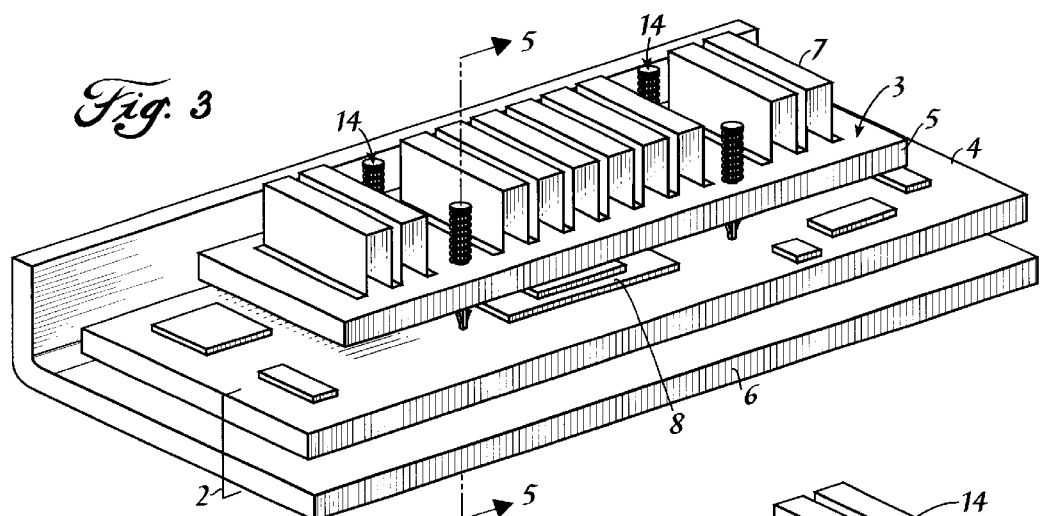
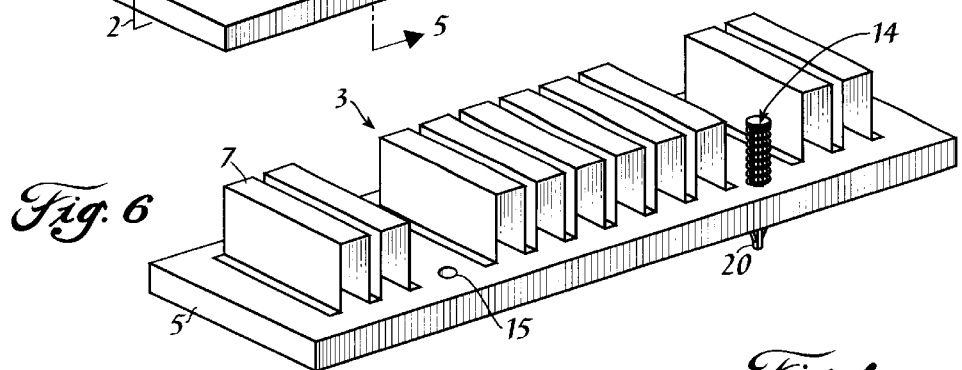
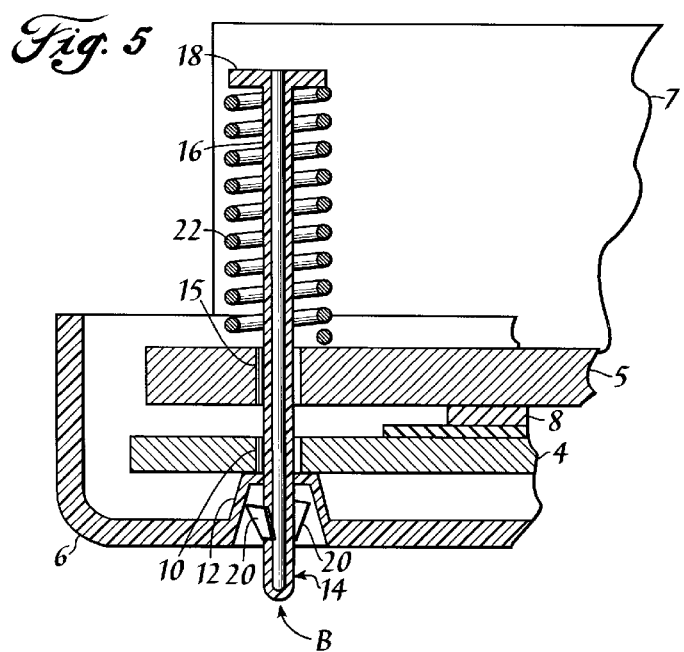
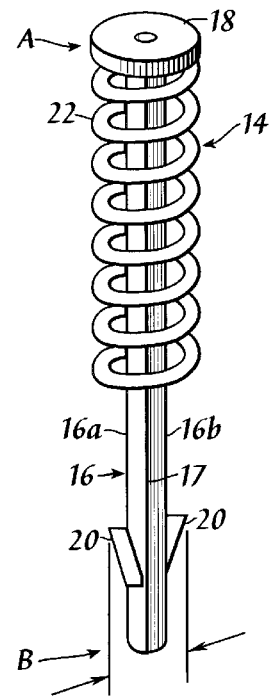

APPARATUS AND METHOD FOR SECURING A HEAT SINK TO AN ELECTRONIC COMPONENT IN A COMPUTER SYSTEM

BACKGROUND

The disclosures herein relate generally to computer systems and, more particularly, to an apparatus and method for securing a heat sink to an electronic component in a computer system.

Heat sinks are commonly used to aid in dissipating heat from electronic components in equipment such as a computer. The heat sink is configured to readily dissipate heat from one or more electronic components to the surrounding atmosphere or to an attached cooling device. Heat sinks may have an extruded, machined, or otherwise formed body with heat dissipating fins or the like for transferring heat from the electronic component. However, to provide for acceptable and efficient heat transfer, the heat sink must be in sufficient contact with the related component.

Various types of heat sink mounting assemblies are known for engaging a heat sink against a related electronic component such as a microprocessor. Many of these types of heat sink mounting assemblies are specifically configured for a given size or type of electronic component. These types of component specific heat sink assemblies may need to be redesigned when the related electronic component is redesigned or otherwise modified.

Some heat sink mounting assemblies are intended to be of a universal configuration. However, they may have one or more limitations, including expensive manufacturing cost, complex installation technique, limited or inconsistent force-generating characteristics, and excessive space requirements.

U.S. Pat. No. 5,883,782 discloses an apparatus for removing heat from the top surface of an electronic package. An electronic package is attached to the top-side of a printed circuit board. The printed circuit board has a first set of through holes positioned symmetrically about the electronic package. A heat sink is placed in thermal contact with the top surface of the electronic package. The heat sink has a second set of through holes that correspond and are align with the first set of through holes. Posts having a first end portion and a second end portion are positioned within the first and second set of through holes such that the first end portions are in abutting engagement with the top surface of the heat sink. The second end portions protrude from the bottom-side of the printed circuit board. The heat sink is held in place by a spring clip. The spring clip includes a substantially flat cross member and a pair of legs extending outward from either side of the cross member. Each one of the legs terminates at a flange section. The flange section of each leg has an opening for receiving the second end portion of a post.

U.S. Pat. No. 5,586,005 discloses a post type fastening member that provides, at one end, an insertion friction connection to the circuit card. At the other end, extending through the heat sink, a compression spring means is provided that urges the heat sink toward the circuit card. A plurality of the post type fasteners are positioned around the periphery of the chip package to retain the heat sink parallel to the circuit card and compressing the chip package. The packaging structure of the invention permits larger area heat sinks than the chip package area to be supported by the circuit card with the only relationship with the chip being that of a compression thermal transfer contact and radiation shield.

U.S. Pat. No. 5,331,507 dicloses a resilient heat sink clip having a pair of legs joined together at one end by an arcuate member. The other ends of the legs each terminate in a hook. The arcuate member bears against a heat sink while pressing it into thermal contact with an electronic device package to conduct heat into the heat sink and then into the atmosphere.

U.S. Pat. No. 5,331,507 dicloses a clip having parallel edge frames with pockets at each end and connected by transverse beams. The clip is used to removably secure a heat sink to an orthogonal device package by inserting the corners of the device package in the pockets to secure the heat sink between the transverse beams and the surface of the device package.

Microprocessor modules without an integral heat spreading plate can pose a unique challenge for mounting a heat sink. The heat sink must be brought into direct contact with the microprocessor chip with a nominal amount of contact pressure applied uniformly over the area of the microprocessor chip. Excessive pressure can deflect the heat sink, reducing the level of heat transfer. Furthermore, excessive pressure can also cause stress concentrations resulting in damage to the microprocessor chip.

Accordingly, a need has arisen for an apparatus and method that allows a heat sink to be economically manufactured and reliably mounted to a heat generating electronic device.

SUMMARY

One embodiment, accordingly, provides a compact, simple and economical retaining clip that may be used to secure a heat sink to an electronic component such as a microprocessor module. To this end, one embodiment provides a retaining clip including a shaft having a first end and a second end. A radially flexible member is attached adjacent to the second end of the shaft. An axially compressible member is carried by the shaft extending axially from adjacent the first end of the shaft towards the second end.

A principal advantage of the embodiments presented herein is that the spring force provided by the spring clip is easily and economically usable for various types of electronic components and heat sinks.

BRIEF DESCRIPTION OF THE DRAWING FIGURES

FIG. 3 is a perspective view illustrating an embodiment of a heat sink attached to a printed circuit module.

FIG. 4 is a perspective view illustrating an embodiment of a retaining clip.

FIG. 5 is an expanded, cross sectional view illustrating an embodiment of a retaining clip attaching a heat sink to a printed circuit module.

FIG. 6 is a perspective view illustrating an embodiment of a heat sink with a retaining clip installed therein.

DETAILED DESCRIPTION

Figure 1:
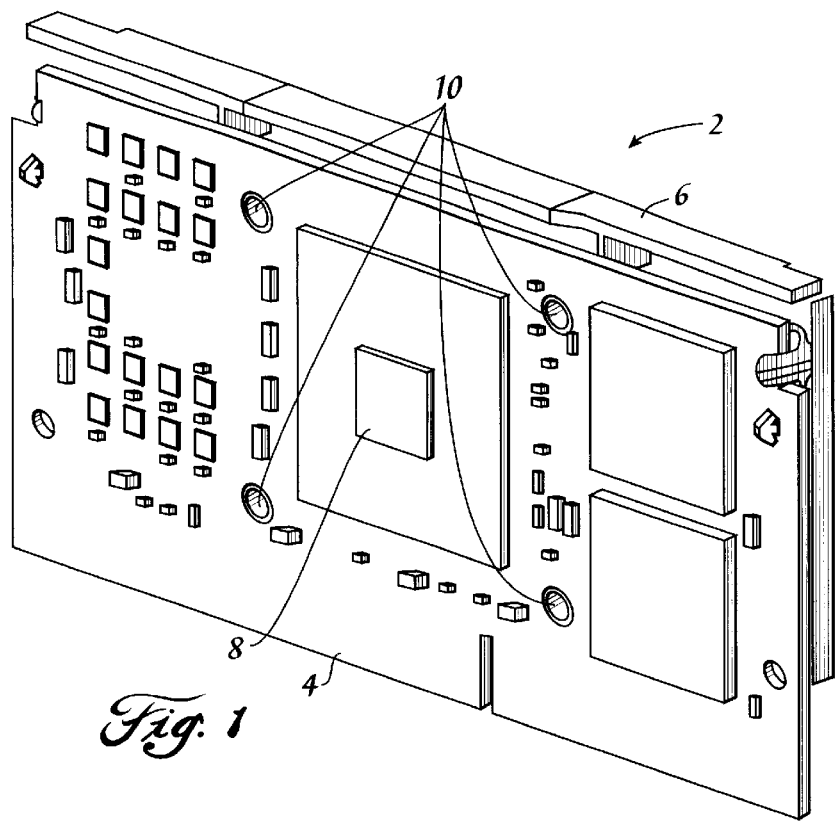
FIG. 1 is a perspective view illustrating an embodiment of the first side of a printed circuit module.
Figure 2:
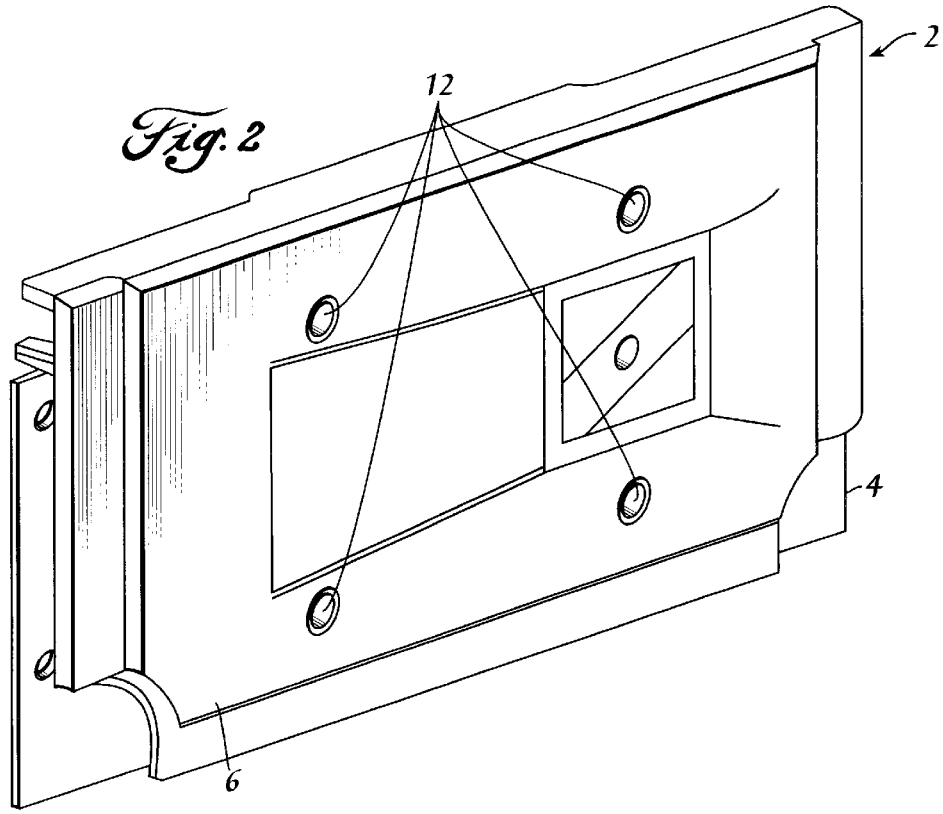
FIG. 2 is a perspective view illustrating an embodiment of the second side of a printed circuit module.

An embodiment of a printed circuit module 2 is illustrated in FIGS. 1 and 2. The printed circuit module 2 includes a printed circuit substrate 4, a cover 6 and an electronic component 8 such as a microprocessor attached to the printed circuit substrate 4. The printed circuit substrate 4 has a pattern of holes 10 for attaching a heat sink. The cover 6 has a pattern of bosses 12 generally aligned with the holes 10.

A heat sink 3, FIG. 3, is attached to the printed circuit module 2 using a plurality of retaining clips 14. The heat sink 3 includes a base 5 and a plurality of cooling fins 7 attached to the base 5. The retaining clips 14 secure the base 5 against the electronic component 8 to facilitate the dissipation of heat.

An embodiment of a retaining clip 14 is illustrated in FIG. 4. Each retaining clip 14 includes a shaft 16 having a flange 18 attached at a first end A, two retention members 20 at a second end B and a resilient member 22 mounted on the shaft 16. The shaft 16 may be formed to include a first portion 16a and a second portion 16b. The first and second portions 16a, 16b abutting each other along respective longitudinally extending edges 17.

As illustrated in FIG. 5, the shaft 16 extends through a hole 15 in the base 5 and the adjacent aligned hole 10 in the printed circuit substrate 4. The resilient member 22 is compressed between the flange 18 and the base 5. The compression of the resilient member 22 generates a force that is applied on the base 5. The force generated by the resilient member 22 is proportional to the amount of compression of the resilient member 22. The retention members 20 are configured to engage a boss 12, FIG. 5, formed in the cover 6 so that the retaining clip 14 can secure the base 5 against the component 8.

To simplify assembly of the heat sink 3 to the printed circuit module 2, the second end B of the shaft 16 may be configured to function as an alignment mechanism. This may be accomplished by tapering or rounding the second end B and extending its length. In this configuration, the second end B will partially enter the adjacent respective hole 10 in the printed circuit substrate 4 prior to the retention members 20 being engaged.

Spring parameters such as free length and spring rate as well as the position of the retention members 20 on the shaft 16 relative to the flange 18 will affect the amount of force applied to the base 5. Depending on the specific construction of the heat sink 3 and the requirements of the associated electronic device, the amount of contact pressure applied between the heat sink base and the adjacent electronic component will typically be from about 5 psi to about 20 psi.

In some applications, it may be desirable to install one or more retaining clips 14 into the base 5 prior to positioning the heat sink 3 adjacent to the printed circuit module as illustrated in FIG. 6. The retention members 20 engage the base 5 to secure the retaining clip 14 in place.

The shaft 16 may be made from a flat metallic sheet material using a variety of known manufacturing processes such as progressive die stamping, drawing, or other suitable processes. The shaft may be constructed to have a split shell construction as illustrated in FIG. 4, as well as in rolled pin configuration, seamless pin configuration or other suitable configurations. The shaft 16 may also be made from a polymeric resin using a known process such as injection molding. A variety of different types of resilient members such as compression springs are commercially available from a variety of sources.

The retention members 20 may be formed separately from the shaft 16 and then attached using a method such as spot welding. Alternately, when forming the shaft 16 using a manufacturing process such as progressive die stamping, the retention members 20 may be formed integrally with the shaft 16, as illustrated in FIG. 4. A benefit of the retention members 20 being integrally formed with the shaft is that it may be done without adding significantly to the cost of the shaft 20.

The retention members 20 are formed to have an expanded width 21, FIG. 4, greater than the width of a respective hole. They are also formed to be resilient such that they can be deflected inward towards the longitudinal axis of the shaft 20. During insertion of the shaft into the hole, the retention members contact an edge of the hole, causing the retention members 20 to deflect inward and allow them to pass through the hole. Upon passing through the hole, the retention members expand, securing the shaft in the hole.

Figure 7:
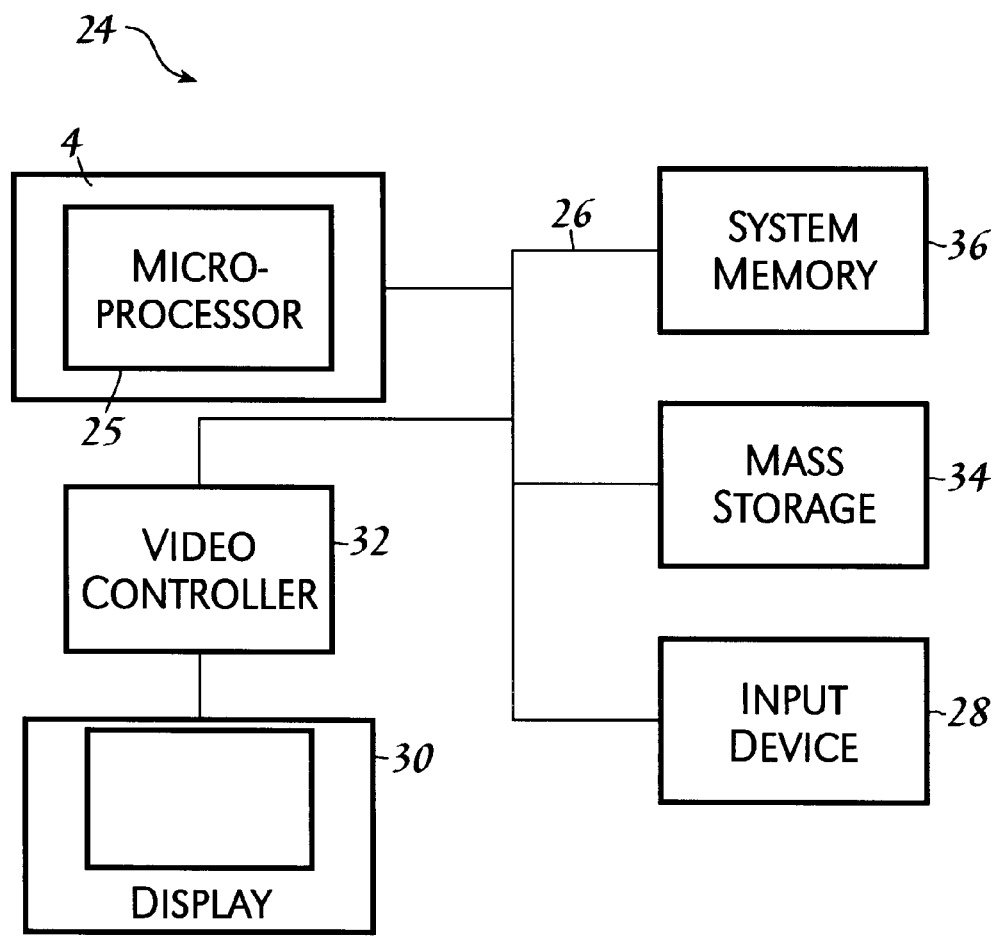
FIG. 7 is a block diagram illustrating an embodiment of a computer system.

FIG. 7 illustrates an embodiment of a computer system, indicated generally at 24. The computer system 24 includes the printed circuit substrate 4 with a microprocessor 25 mounted thereon. The microprocessor 25 is connected to a bus 26. The bus 26 serves as a connection between the microprocessor 25 and other components of the computer system 24. An input device 28 is coupled to the microprocessor 25 to provide input to the microprocessor 25. Examples of input devices include keyboards, touchscreens, and pointing devices such as a mouse, a trackball and a trackpad. The computer system 24 further includes a display 30 which is coupled to the microprocessor 25 typically by a video controller 32. Programs and data are stored on a mass storage device 34 which is coupled to the microprocessor 25. Mass storage devices include components such as hard disks, optical disks, magneto-optical drives, floppy drives, and the like. A system memory 36 provides the microprocessor 25 with fast storage to facilitate execution of computer programs by the microprocessor 25. It should be understood that other busses and intermediate circuits can be employed between the components described above and microprocessor 25 to facilitate interconnection between the components and the microprocessor.

In operation, the embodiments disclosed herein provide a retaining clip having a shaft that is inserted through aligned holes in a printed circuit substrate and a heat sink base. The insertion of the shaft through the printed circuit substrate compresses a resilient member carried on the shaft. The compression of the resilient member generates a contact force between the heat sink base and the adjacent electronic component mounted on the printed circuit substrate. Retention members at the second end of the shaft are configured to engage bosses formed in the cover of the printed circuit module to securely fasten the heat sink in position.

As a result, one embodiment provides a retaining clip including a shaft having a first end and a second end. A radially flexible member is attached adjacent to the second end of the shaft. An axially compressible member is carried by the shaft extending axially from adjacent the first end of the shaft towards the second end.

Another embodiment provides a retaining clip including a shaft having a first end and a second end. A flange is integrally formed with the shaft adjacent to the first end of the shaft. A plurality of radially flexible tab members are integrally formed with the shaft adjacent the second end. A resilient member is carried by the shaft extending from adjacent the flange towards the flexible tab members.

In yet another embodiment, an electronic package includes a printed circuit substrate and an electronic component mounted on the printed circuit substrate. A heat sink base is positioned in contact with the electronic component.

A shaft extends through the heat sink base and printed circuit substrate. A flange is attached adjacent a first end of the shaft. An elongated resilient member is carried by the shaft. The resilient member is compressed between the flange and the heat sink base. A securing device retains the shaft at a fixed position relative to the printed circuit substrate.

A further embodiment provides a computer system including a printed circuit module including a printed circuit substrate. A microprocessor is mounted on the printed circuit substrate. An input is coupled to provide input to the microprocessor. A mass storage is coupled to the microprocessor and a display is coupled to the microprocessor by a video controller. A system memory is coupled to provide storage to facilitate execution of computer programs by the microprocessor. A heat sink base is positioned in contact with the electronic component. A shaft extends through the heat sink base and printed circuit substrate. A flange is attached adjacent to a first end of the shaft. An elongated resilient member is carried by the shaft. The resilient member is compressed between the flange and the heat sink base. A plurality of retention members are integrally formed with the shaft for engaging the printed circuit module.

In still another embodiment, a method of making a retaining clip for securing a component to a heat sink is provided. The method includes the steps of forming a shaft having a first end and a second end; forming a flange attached adjacent to the first end of the shaft; forming a radially flexible retention member attached adjacent to the second end of the shaft; and mounting an axially compressible resilient member on the shaft extending axially from adjacent the flange towards the retention member.

As it can be seen, the illustrative embodiments presented herein provide several advantages. The retaining clip is manufactured cost-effectively using readily available materials and manufacturing methods. The relatively small size of the apparatus enables a broad range of mounting locations for a given application. The spring force generated by the component is easily adjusted for various types of electronic components and heat sinks. One or more retaining clips may be pre-installed in the base of the heat sink.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A retaining clip, comprising:
   a shaft having a first end and a second end;
   a radially flexible member attached adjacent to and axially set back from the second end of the shaft so that the second end extends substantially from the radially flexible member; and
   an axially compressible member carried by the shaft extending axially from adjacent the first end of the shaft towards the second end, whereby the second end is substantially exposed for further aligned engagement of the clip and a cover including a boss and a hole formed in the boss, the radially flexible member engaging the hole for securing the shaft on the cover member.

2. The retaining clip of claim 1 wherein the axially compressible member is a helically wound spring.

3. The retaining clip of claim 1 wherein the radially flexible member and the shaft are integrally formed.

4. The retaining clip of claim 1 wherein the shaft includes a flange integrally formed therewith.

5. The retaining clip of claim 1 wherein the shaft is tapered at the second end.

6. The retaining clip of claim 1 wherein the shaft includes a first portion and a second portion, the first and second portions abutting each other along respective longitudinally extending edges.

7. The retaining clip of claim 4 wherein the axially compressible member is retained on the shaft between the flange and the radially flexible member.

8. A retaining clip, comprising:
   a shaft having a first end and a second end;
   a flange integrally formed with the shaft adjacent to the first end of the shaft;
   a plurality of radially flexible tab members integrally formed with the shaft adjacent to and axially set back from the second end so that the second end extends substantially from the radially flexible member; and
   a resilient member carried by the shaft extending from adjacent the flange towards the flexible tab members, whereby the second end is substantially exposed for further engagement of the clip and a cover including a boss and a hole formed in the boss, the tab members engaging the hole for securing the shaft on the cover.

9. An electronic package, comprising:
   a printed circuit substrate;
   an electronic component mounted on the printed circuit substrate;
   a heat sink base positioned in contact with the electronic component;
   a shaft extending through the heat sink base, the shaft having a first end and a second end;
   a flange attached adjacent the first end of the shaft;
   an elongated resilient member carried by the shaft, the resilient member being compressed between the flange and the heat sink base; and
   a radially flexible member attached adjacent to and axially set back from the second end of the shaft so that the second end extends substantially from the radially flexible member, whereby the second end is substantially exposed for aligned engagement with the printed circuit substrate and a cover adjacent the base and the component, the cover member including a boss and a hole formed in the boss, the radially flexible member engaging the hole for securing the shaft on the cover member.

10. The electronic package of claim 9 wherein the resilient member is a helically wound spring.

11. A computer system, comprising:
   a printed circuit module including a printed circuit substrate;
   a microprocessor mounted on the printed circuit substrate;
   an input coupled to provide input to the microprocessor;
   a video controller coupled to the microprocessor;
   a system memory coupled to provide storage to facilitate execution of computer programs by the microprocessor;
   a heat sink base positioned in contract with the microprocessor;
   a shaft extending through the heat sink base, the shaft having a first end and a second end;
   a flange attached adjacent the first end of the shaft;
   an elongated resilient member carried by the shaft, the resilient member being compressed between the flange and the heat sink base; and a radially flexible member attached to and axially set back from the second end of the shaft so that the second end extends substantially from the radially flexible member, whereby the second end is substantially exposed for aligned engagement with the printed circuit substrate and a cover adjacent the base and the component, the cover member including a boss and a hole formed in the boss, the radially flexible member engaging the hole for securing the shaft on the cover member.

* * * * *